(12) United States Patent
Ferrari et al.

(10) Patent No.: US 6,472,244 B1
(45) Date of Patent: Oct. 29, 2002

(54) MANUFACTURING METHOD AND INTEGRATED MICROSTRUCTURES OF SEMICONDUCTOR MATERIAL AND INTEGRATED PIEZORESISTIVE PRESSURE SENSOR HAVING A DIAPHRAGM OF POLYCRYSTALLINE SEMICONDUCTOR MATERIAL

(75) Inventors: Paolo Ferrari, Gallarate; Benedetto Vigna, Potenza; Flavio Villa, Milan, all of (IT)

(73) Assignee: SGS-Thomson Microelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/723,357

(22) Filed: Nov. 27, 2000

Related U.S. Application Data

(60) Division of application No. 09/110,692, filed on Jul. 7, 1998, now abandoned, which is a continuation-in-part of application No. 08/903,164, filed on Jul. 30, 1997, now abandoned.

(30) Foreign Application Priority Data

Jul. 31, 1996 (EP) ............................................. 96830437
Jul. 7, 1997 (EP) ............................................. 97830339

(51) Int. Cl.⁷ ............................................. H01L 21/00
(52) U.S. Cl. ............................................. 438/53; 438/50
(58) Field of Search ............................. 438/50, 52, 53, 438/17, 439, 444

(56) References Cited

U.S. PATENT DOCUMENTS

| | | | |
|---|---|---|---|
| 4,003,127 A | | 1/1977 | Jaffe et al. ...................... 29/580 |
| 4,508,757 A | * | 4/1985 | Fabricius et al. ............ 438/444 |
| 4,665,610 A | | 5/1987 | Barth ............................ 29/580 |
| 4,977,101 A | * | 12/1990 | Yoder et al. ................... 438/53 |
| 5,095,401 A | | 3/1992 | Zavracky et al. ............ 361/283 |
| 5,231,301 A | | 7/1993 | Peterson et al. ............. 257/419 |
| 5,286,341 A | | 2/1994 | Trah ............................ 156/630 |
| 5,369,544 A | | 11/1994 | Mastrangelo .............. 361/283.4 |
| 5,578,755 A | | 11/1996 | Offenberg ................... 73/514.3 |
| 5,596,219 A | | 1/1997 | Hierold ........................ 257/467 |
| 5,616,514 A | | 4/1997 | Muchow et al. .............. 438/50 |
| 5,681,997 A | | 10/1997 | McHale et al. ................ 73/727 |
| 5,914,520 A | | 6/1999 | Werner ........................ 257/415 |

FOREIGN PATENT DOCUMENTS

| | | | |
|---|---|---|---|
| EP | 0 624 900 | 11/1994 | ........... H01L/21/76 |
| WO | WO 92/22820 | 12/1992 | |
| WO | WO 93/18382 | 9/1993 | ............. G01L/9/00 |

OTHER PUBLICATIONS

European Search Report from European Patent Application 97830339.4, filed Jul. 7, 1997.

(List continued on next page.)

*Primary Examiner*—Kevin M. Picardat
(74) *Attorney, Agent, or Firm*—Wolf, Greenfield & Sacks, P.C.; James H. Morris

(57) ABSTRACT

The method inlcudes the steps of forming a sacrificial buried region of insulating material on a substrate of monocrystalline semiconductor material, epitaxially growing a first semiconductor material layer on the substrate, the first semiconductor material layer including a polycrystalline region over the sacrificial buried region and a monocrystalline region elsewhere, the substrate and the semiconductor material layer surrounding the sacrificial buried region on all sides, and removing the sacrificial buried region. The portion of the polycrystalline region surrounded by the trench thus forms a suspended structure separated and isolated thermally from the rest of the semiconductor material layer. Using microelectronics processes, electronic components are formed in the monocrystalline region, and dedicated regions are formed at the suspended structure, so that the electronic components are integrated in the same chip with static, kinematic or dynamic microstructures.

32 Claims, 6 Drawing Sheets

OTHER PUBLICATIONS

European Search Report from European application No. 96830337.8, filed Jul. 31, 1996.

Micromachining and ASIC Technology, Stoffel, Microelectronics J., 25 (1994) pp. 145–156.

Silicon–on–Insulator Wafer bonding–Wafer Thinning Technological Evaluations, Haisma et al., JP J of Applied Physics, vol. 28, No. 8, Aug. 1989, pp. 1426–1443.

Semiconductor Sensors, Sze, A Wiley–Interscience Publication. No date.

Short Course in Silicon Sensor Technology, Ruggero Castagnetti, Physical Electronics Laboragtory, Swiss Federal, Federal Institute of Technology, Zurich. No date.

* cited by examiner

MANUFACTURING METHOD AND INTEGRATED MICROSTRUCTURES OF SEMICONDUCTOR MATERIAL AND INTEGRATED PIEZORESISTIVE PRESSURE SENSOR HAVING A DIAPHRAGM OF POLYCRYSTALLINE SEMICONDUCTOR MATERIAL

CROSS REFERENCE TO RELATED APPLICATIONS

This application is a divisional of application Ser. No. 09/110,692, filed Jul. 7, 1998, entitled MANUFACTURING METHOD AND INTEGRATED MICROSTRUCTURES OF SEMICONDUCTOR MATERIAL AND INTEGRATED PIEZORESISTIVE PRESSURE SENSOR HAVING A DIAPHRAGM OF POLYCRYSTALLINE SEMICONDUCTOR MATERIAL, now abandoned, which in turn is a continuation-in-part of application Ser. No. 08/903,164, filed Jul. 30, 1997, entitled METHOD FOR FABRICATING INTEGRATED MICROSTRUCTURES OF SEMICONDUCTOR MATERIAL, now abandoned, which prior applications are incorporated herein by reference.

BACKGROUND OF THE INVENTION

1. Field of the Invention

The present invention relates to a method of fabricating integrated microstructures of semiconductor material and, in particular, to a method of fabricating an integrated piezoresistive pressure sensor having a diaphragm of polycrystalline semiconductor material. The present invention also relates to an integrated piezoresistive pressure sensor having a diaphragm of polycrystalline semiconductor material.

2. Discussion of the Related Art

Micromachining, which is based on microelectronic fabrication techniques, provides fabrication methods for microsystems such as microsensors, microactuators and special micromechanisms. In recent years, micromachining techniques have been developed for producing integrated pressure microsensors of semiconductor material. These sensors provide numerous advantages in comparison to traditional sensors: reduced cost, high degree of performance and reliability, better signal-to-noise ratio, possibility of integration with memory circuits for producing intelligent sensors, possibility of on-line self-testing, and greater reproducibility. As such, integrated pressure microsensors are increasingly used in the automotive industry, contributing to greater safety and environmental protection with absolutely no increase in vehicle cost.

Currently marketed semiconductor pressure microsensors are typically based on three physical effects: 1) a piezoresistive effect whereby the pressure-induced inflection of a silicon diaphragm unbalances a Wheatstone bridge comprising resistors diffused in the diaphragm; 2) a capacitive effect whereby pressure induces a displacement of a diaphragm forming the movable electrode of a capacitor (thus resulting in a variation in capacitance); and 3) a resonant effect whereby the pressure inflects a diaphragm to which a resonant structure is fixed and this mechanical deformation varies the oscillation frequency of the structure. For the sensor to operate effectively, the diaphragms must be of uniform, accurately controlled thickness with no intrinsic mechanical stress. These characteristics are typically achieved by forming the microstructures by plasma or wet etching, isotropically (for profiles coincident with the crystal faces) or anisotropically (for generating profiles which are independent from the crystal orientation).

Many specialized techniques have been developed to fabricate such microstructures. One such fabrication technique employs etching solutions such as ethyldiaminapyrocatechol (EDP), whereby a structure is formed and separated from the substrate by etching the bulk silicon from the front of the wafer using what is known as the "front bulk micromachining" technique.

In the mid 80's, "surface micromachining" was proposed, whereby the sensitive element or micromechanism was formed of polycrystalline silicon, and which provides for forming suspended structures by depositing and subsequently removing sacrificial layers of different types, e.g. silicon oxide or nitride, porous silicon, aluminum, photoresist, polyimide, etc. Surface micromachined suspended structures, however, are characterized by poor flexural rigidity, and have a tendency to collapse onto the underlying layer, thus impairing thermal or mechanical isolation. A general review of surface micromachining technology (as well as bulk micromachining and the characteristics of each) is to be found, for example, in the article entitled "Micromachining and ASIC Technology" by Axel M. Stoffel, in Microelectronics Journal, 25 (1994), p. 145–156.

Several industrial laboratories and research centers have produced prototype integrated microstructures using the surface micromachining technique. Details of these are to be found, for example, in the articles: "Novel fully CMOS-compatible vacuum sensor", by O. Paul, H. Baltes, in Sensors and Actuators A 46–47 (1995) p. 143–146, in which a diaphragm of dielectric material is formed on a sacrificial metal layer; "Surface-Micromachined Piezoresistive Pressure Sensor" by T. Lisec, H. Stauch, B. Wagner, in Sensor 95 Kongressband, AO1.2, p. 21–25, in which both the sacrificial layer and the diaphragm are of polysilicon and separated by a small layer of silicon oxide; and "Surface-Micromachined Microdiaphragm Pressure Sensors" by S. Sugiyama, K. Shimaoka, O. Tabata, in Sensors and Materials 4, 5 (1993), p. 265–275, in which use is made of a sacrificial polysilicon layer and a silicon nitride layer as the diaphragm.

Though they do in fact provide for better integrating the devices, the above surface micromachining techniques pose serious problems with regard to the quality of the deposited films (amorphous or polycrystalline) to form the diaphragms, stiction of the suspended structures on the silicon substrate, and packaging difficulties.

In the early 90's, a further microstructure fabrication technique, known as "silicon fusion bonding", was devised, whereby a cavity is formed in a monocrystalline silicon wafer onto which a further monocrystalline silicon wafer, in which the sensor is formed, is bonded.

A similar microstructure fabrication technique employs dedicated or nondedicated SOI (Silicon-on-Insulator) substrates.

Other highly specialized techniques, such as "wafer dissolving," provide for forming silicon microstructures by means of dedicated processes which are totally incompatible with standard planar microelectronics technology. In a sense, these "ad hoc" processes simply consist of transferring onto silicon what is currently done using other materials, and only provide for fabricating the sensitive portion, so that the processing and control circuit must be formed on a separate chip.

Yet another highly specialized technique is the LIGA method—a German acronym for Lithographie Galvanoformung Abformung—which comprises three processing steps:

synchrotron x-ray lithography; galvanic deposition of metal films; and formation of plastic molds (see, for example, S.M.Sze's "Semiconductor Sensors", John Wiley & Sons, Inc., Chapter 2, p. 75–78).

At present, diaphragms of semiconductor material (silicon) are produced using the bulk micromachining technique, which is described in detail, for example, in the articles "CMOS Integrated Silicon Pressure Sensor" by T. Ishihara, K. Suzuki, S. Suwazono, M. Hirata and H. Tanigawa, IEEE Journal Sol. St. Circuits, vol. Sc-22, April 1987, 151–156, and "Micromachining and ASIC Technology" by A. M. Stoffel, Microelectronics Journal 25 (1994) 145–156. Bulk micromachining typically involves processing a silicon wafer on both faces to exploit the excellent mechanical properties of monocrystalline silicon. However, front-to-rear processing, and the need for particular handling of the wafers make bulk micromachining incompatible with current integrated circuit fabrication technology.

Another method, known as the electrochemical stop method using a PN junction, provides for more accurately controlling the thickness of the diaphragm and eliminating any process-induced tensile or compressive stress. The electrochemcial stop method involves forming a diaphragm in an N-type monocrystalline semiconductor layer (e.g. the epitaxial layer) on a P-type substrate. The N-type layer is masked except for a previously implanted anode contact region. The rear of the substrate is masked with a mask presenting a window aligned with the region in which the diaphragm is to be formed; a positive potential difference is applied between the N-type layer and the substrate, via the anode contact region, after which the P-type substrate is chemically etched for a few hours at a relatively low temperature (e.g. 90° C.). The chemical etching terminates automatically at the PN junction, forming the diaphragm from the N-type layer at the removed substrate region.

FIGS. 1A, 1B and 1C illustrate typical fabrication steps for forming an absolute piezoresistive pressure microsensor using the electrochemical stop method. The initial steps are those commonly adopted in the fabrication of integrated circuits. In particular, starting from a wafer 1 of monocrystalline silicon comprising a P-type substrate 2 and an N-type epitaxial layer 3, P-type junction isolation regions 4 extending from the upper surface of wafer 1 to substrate 2 are formed in epitaxial layer 3. An integrated circuit is then formed, for example, an NPN transistor with an N+-type collector contact region 6, a P-type base region 7, and an N+-type emitter region 8, as shown in FIG. 1A. Simultaneously with the integrated circuit, the diffused resistors (only one of which, comprising a P-type resistive layer 10, is shown) and one anode region for each wafer and each diaphragm (N+-type region 11 in FIG. 1A) are formed. The resistors are preferably formed in the same implant step of base region 7 of the NPN transistor. Anode region 11 is preferably formed in the same step as one of the N-type regions of the integrated circuit (e.g. when implanting collector contact region 6 or emitter region 8). A dielectric layer 12 is then deposited, and metal contacts 13 are formed.

Thereafter, wafer 1 is masked with a front mask 15 and a rear mask 16. The front mask 15 (of silicon oxide) covers the whole of the upper surface of wafer 1 except for a window at anode region 11, and the rear mask 16 (of silicon nitride or oxide) covers the whole of the lower surface of the wafer except for the region in which the diaphragm is to be formed, as shown in FIG. 1B. The rear of the wafer is then subjected to anisotropic etching while epitaxial layer 3 is biased, via anode region 11, at a positive voltage (e.g. 5V) with respect to substrate 2. Anisotropic etching terminates automatically at epitaxial layer 3, and the portion of epitaxial layer 3 at the removed portion of substrate 2 forms the diaphragm 18.

Following removal of masks 15 and 16, wafer 1 is bonded to a sheet of glass 17 (FIG. 1C) using an anodic bonding method whereby a medium-high voltage (e.g. 500 V) is applied between wafer 1 and sheet 17 for a few hours at a temperature of 300 to 400° C. Alternatively, wafer 1 may be bonded to the sheet of glass 17 using the glass frit bonding method, which typically requires lower temperatures. Finally, sheet 17 is fixed to container 19.

The above method presents the following drawbacks: it is incompatible with batch processing techniques, due to the electric contacts on each wafer; the rear etching of wafer 1 poses problems in terms of front-rear alignment; the thickness of wafer 1 demands prolonged etching; the scaling problems involved are such as to preclude the integration of structures smaller than a few hundred micrometers; and, once the diaphragm is formed, wafer 1 must invariably be bonded to a glass support, both for absolute and differential sensors (which require holes aligned with the diaphragm, thus posing further alignment problems).

Furthermore, the anisotropy of etching causes a reduction of the otherwise available area of wafer 1; the chemical agents used, (including, for example, potassium or sodium), may contaminate the chip, causing problems in the circuit integration; and it is very difficult to control the thickness of the active diaphragm, which causes problems with sensor reproducibility.

The above drawbacks make it difficult to integrate the method in currently used integrated circuit technology. Therefore, several pressure microsensor manufacturers have opted to form a double integrated chip: one chip contains the diaphragm microstructure, while the other provides for processing the signal. Single-chip integrated sensors also exist, but are not batch processed.

None of the above methods provides a method for fabricating low-cost sensors comparable with those of microelectronics technology, using known, highly controllable, noncritical fabrication steps, and which may be integrated with the control electronics in one chip.

SUMMARY OF THE INVENTION

It is an object of the present invention to provide microstructures of semiconductor material designed to overcome the drawbacks typically associated with current technology, as well as methods of fabricating such microstructures.

The method of the present invention provides, in one embodiment, a sacrificial buried region of insulating material formed on a monocrystalline semiconductor material substrate. A polycrystalline region for forming the sensitive element or micromechanism is formed over the sacrificial buried region, a monocrystalline region is grown elsewhere, and after the electronic components are formed, portions of the polycrystalline region are selectively removed via trenches in the polysilicon to form a suspending region in which static, kinematic or dynamic microstructures are formed.

According to one embodiment of the method of the present invention, the sacrificial buried oxide region can be formed by sequentially depositing an oxide layer and a nitride layer over the substrate, photolithographically defining a window in the nitride layer to expose a portion of the underlying oxide layer, followed by growth of a thermal oxide layer.

According to another embodiment, the sacrificial buried region can be formed by photolithographically defining a window in both the nitride and oxide layers, using the nitride as an etch mask to define a recess in the substrate, followed by growth of a thermal oxide layer in the recess.

According to another embodiment, the sacrificial buried oxide region can be formed by depositing or growing an oxide region and photolithographicaly defining a region of oxide on the substrate.

After the formation of the sacrificial buried oxide region by any of the methods previously described, a semiconductor material layer is deposited over the substrate and then selectively removed to provide a germ region for epitaxial growth over the sacrificial buried oxide region. The semiconductor material layer can be amorphous or polycrystalline silicon.

At this point in the method of the present invention, standard fabrication techniques can be used to form integrated electronic components in the first semiconductor material layer.

In order to isolate the electronic components, regions surrounding the sensitive regions are photolithographically defined, followed by etching the regions and the sacrificial buried oxide region to form a suspended area.

The present invention also provides an integrated microstructure of semiconductor material, formed in a semiconductor material layer over a substrate where the semiconductor material layer is polycrystalline and monocrystalline elsewhere. The microstructure is formed over a sacrificial buried region and also includes an opening located between the substrate and the polycrystalline region. The opening is a trench that extends between an outer surface of the semiconductor material layer and the opening. The polycrystalline region thus forms, over the opening, a suspended structure supporting integrated microsensors and micromechanisms. The suspended structure is supported by connecting and supporting portions that extend between an inner portion of the polycrystalline region in which the microstructures are formed and outer regions of the semiconductor material layer.

DETAILED DESCRIPTION

The present invention relates to a method of fabricating integrated microstructures of semiconductor material that include suspended structures. In preferred embodiments, the suspended microstructures are diaphragms formed from polycrystalline semiconductor material. The suspended structures of the present invention are formed by etching a sacrificial buried layer of silicon dioxide formed on the surface of a semiconductor wafer. The present invention provides various methods for forming and etching the sacrificial buried layer. In a preferred embodiment, the method of the invention provides a piezoresistive pressure sensor including a suspended diaphragm of polycrystalline semiconductor material.

Figure 1A:
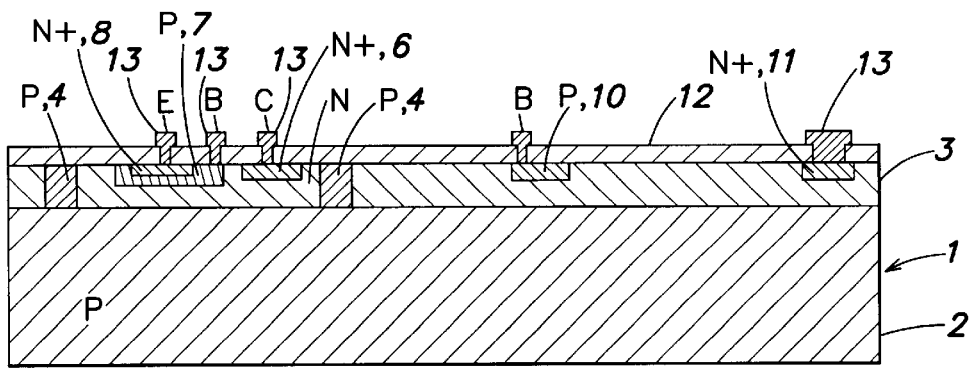
FIG. 1A is a cross-sectional illustration of a wafer of semiconductor material showing an NPN transistor formed during the fabrication of a known sensor according to the electrochemical stop method.
Figure 1B:
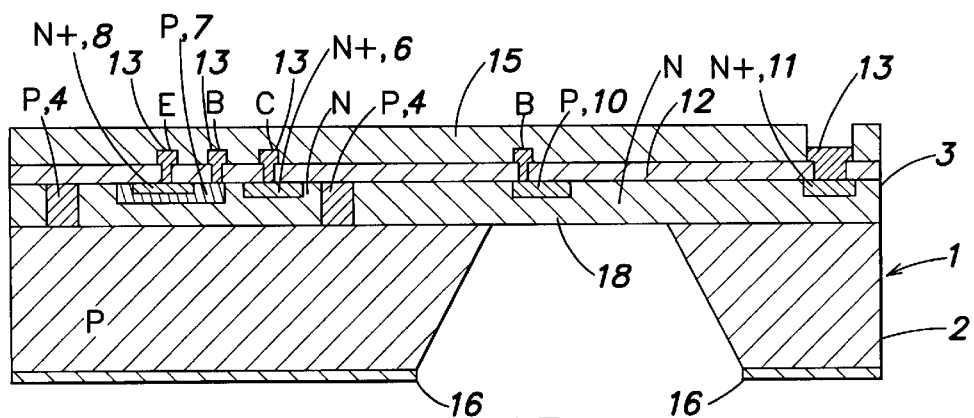
FIG. 1B is a cross-sectional illustration of the wafer of semiconductor material of FIG. 1A after ansotropic etching through the rear surface of the wafer to form a diaphragm.
Figure 1C:
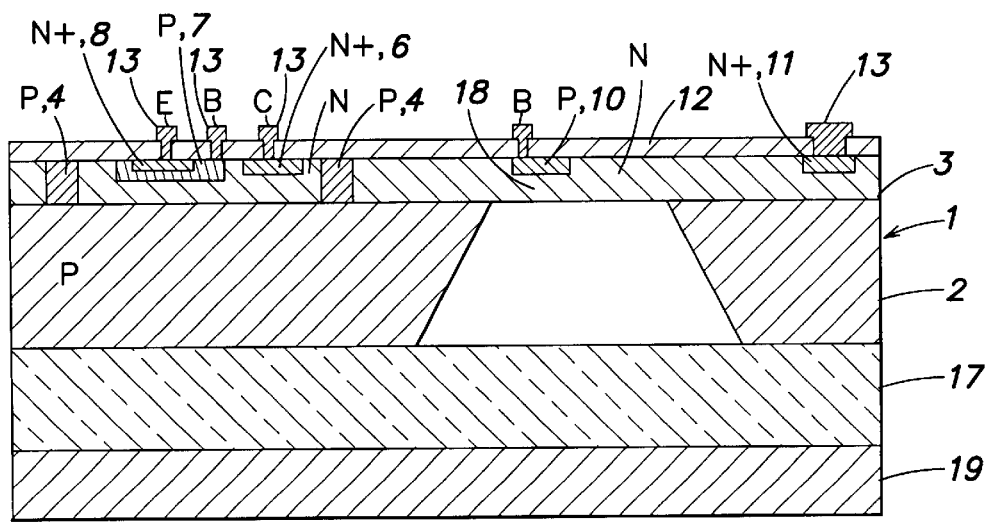
FIG. 1C is a cross-sectional illustration of the wafer of semiconductor material of FIG. 1A after bonding to a sheet of glass.
Figure 2A:
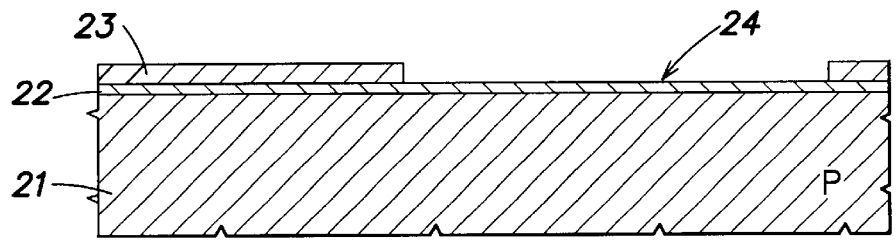
FIG. 2A is a cross-sectional illustration of a wafer of semiconductor material having successive depositions of silicon oxide and nitride, followed by the photolithographic and etch steps to define an opening in the nitride during the fabrication of a sacrificial buried region according to one aspect of the present invention.
Figure 2B:
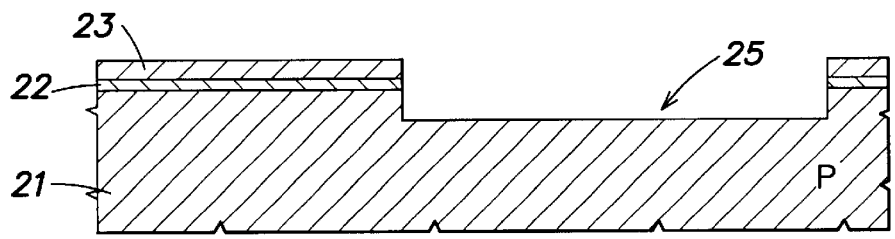
FIG. 2B shows an intermediate structure formed after the steps illustrated in FIG. 2A, in which a recess is formed in the semiconductor wafer.
Figure 2C:
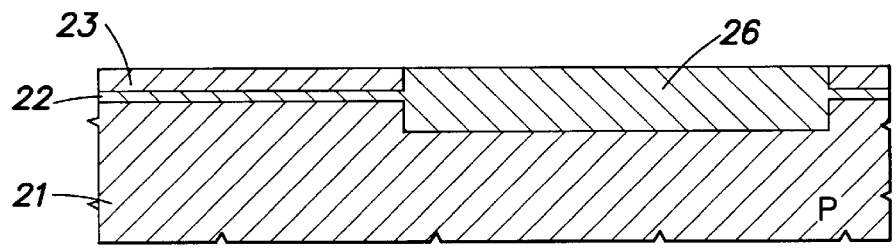
FIG. 2C illustrates the window of FIG. 2B after filling the recess with oxide.

FIGS. 2A through 2E illustrate one embodiment of the present fabrication method for forming the sacrifical buried oxide region. Referring initially to FIG. 2A, a silicon oxide layer 22 is formed, preferably thermally grown, on a P-type single crystal silicon wafer substrate 21. A silicon nitride layer 23 is then deposited on oxide layer 22, followed by photolithographic and etching steps, which are performed to remove that portion of nitride corresponding to the region in which a suspended structure is to be formed. The resist masking layer is then removed to obtain the intermediate structure shown in FIG. 2A, in which nitride layer 23 has a window 24. Thereafter, silicon oxide layer 22 and substrate 21, masked by nitride layer 23, are successively etched to obtain the intermediate structure shown in FIG. 2B, in which oxide layer 22 and part of substrate 21 form a recess 25. As shown in FIG. 2C, recess 25 is subsequently filled with an oxide, which is preferably thermally grown in the present embodiment, to form a sacrificial buried oxide region 26, preferably having a thickness of about 2μm.

Figure 2D:
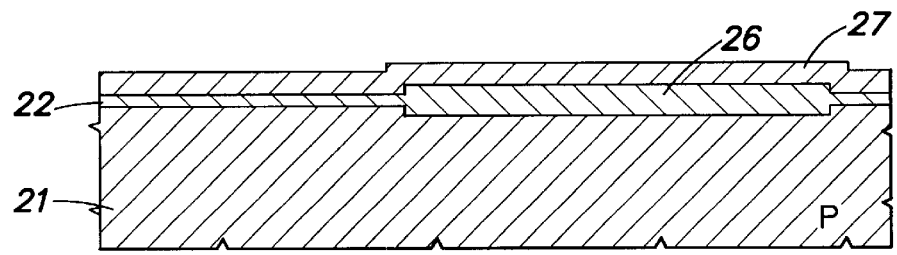
FIG. 2D illustrates the wafer of FIG. 2C after deposition of a polysilicon crystalline layer.
Figure 2E:
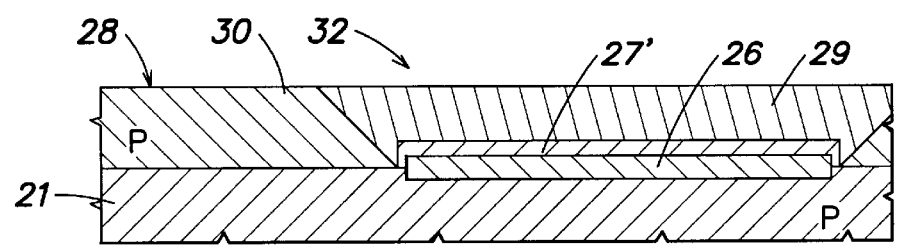
FIG. 2E illustrates the wafer of FIG. 2D showing an epitaxial layer formed after the polycrystalline layer deposited on the wafer shown in FIG. 2D was etched to form a germ for the growth of the epitaxial layer.

After filling recess 25, silicon nitride layer 23 is removed, followed by the deposition of an amorphous or polycrystalline silicon layer 27, as shown in FIG. 2D. Polysilicon layer 27, with the exception of the portion over sacrificial buried oxide region 26, and oxide layer 22 over substrate 21, are then removed by means of photolithographic and etching steps. Thus, a silicon region 27' is obtained over sacrificial buried oxide region 26, as shown in FIG. 2E, which represents the germ for the next step of growing an epitaxial layer. If desired, doping species may also be implanted to form buried structures prior to growing the epitaxial layer, such as, for example, but not limited to, buried layer 9 in FIGS. 5 and 6). An epitaxial layer 28 is then grown, thereby forming a polycrystalline structure (polysilicon region 29) over sacrificial buried oxide region 26, and a monocrystalline structure (epitaxial region 30) elsewhere, as shown in FIG. 2E. Thus, a wafer 32 is obtained, as shown in FIG. 2E, preferably including an epitaxial layer 28 thickness of between about 5 μm and about 10 μm.

Figure 3:
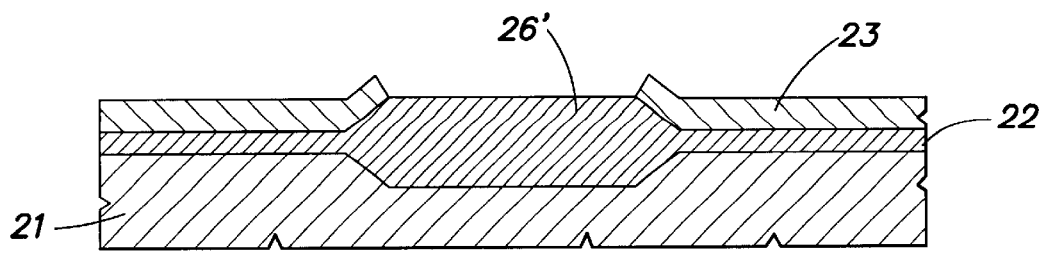
FIG. 3 is a cross-sectional illustration of an alternate method of forming the sacrificial buried oxide region, according to aspect of the present invention.

An alternative method for forming the sacrificial buried region is illustrated in FIG. 3. According to this embodiment, the intermediate structure shown in FIG. 2A, as masked by nitride layer 23, is oxidized locally to form a sacrificial buried oxide region 26' at window 24. The intermediate structure typically includes "bird's beaks", as shown, that extend beneath nitride layer 23. The successive steps shown in FIGS. 2C–2E are then performed. Since, in the present embodiment, the sacrificial buried oxide region is grown directly by local oxidation, without forming recess 25 beforehand, the etching of oxide layer 22 and substrate 21 are eliminated.

Figure 4A:
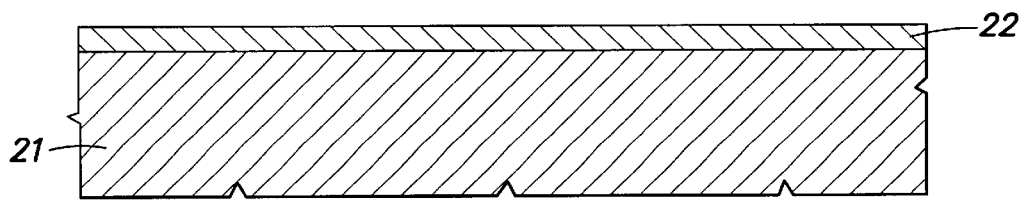
FIG. 4A is a cross-sectional illustration of a wafer of semiconductor material on which a layer of silicon oxide has been formed during the fabrication of a sacrificial buried region according to another aspect of the present invention.
Figure 4B:
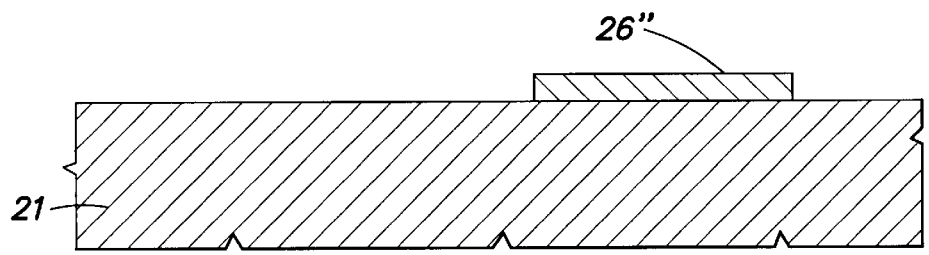
FIG. 4B shows an intermediate structure formed after defining the oxide of FIG. 4B.
Figure 4C:
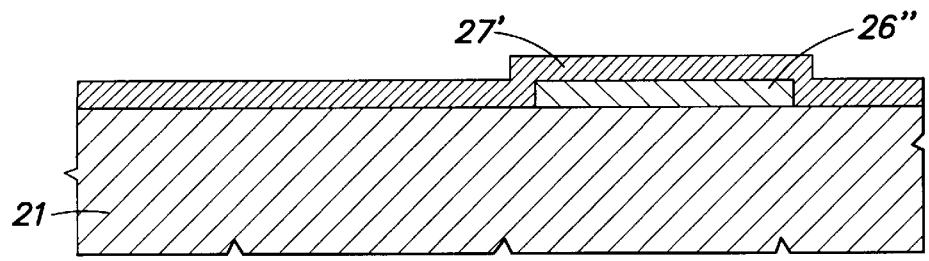
FIG. 4C illustrates the wafer of FIG. 4B after deposition of a polysilicon crystalline layer.
Figure 4D:
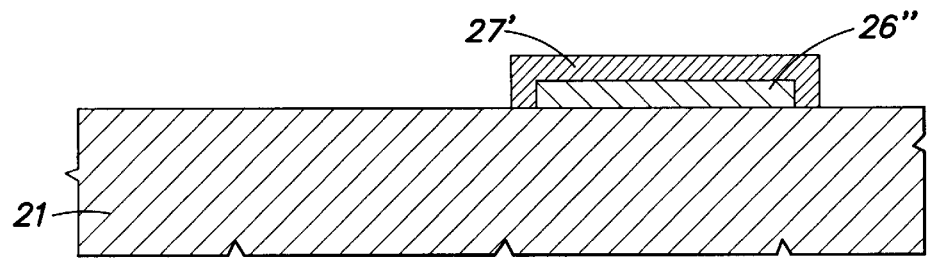
FIG. 4D illustrates the wafer of FIG. 4C the polysilicon crystalline layer has been defined to form a germ for growth of an epitaxial layer.
Figure 4E:
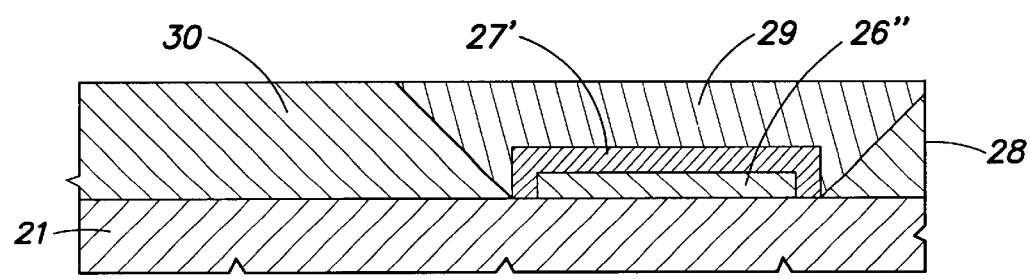
FIG. 4E illustrates the wafer of FIG. 4D showing the epitaxial layer formed after the polycrystalline layer deposited on the wafer shown in FIG. 4D was etched to form a germ for the growth of the epitaxial layer.

A further embodiment for forming the sacrificial buried oxide region is shown in FIGS. 4A–4E. According to this embodiment, a sacrificial buried oxide region 26" is formed by depositing or thermally growing an oxide layer 22 on substrate 21, as shown in FIG. 4A. The silicon oxide layer 22 is defined to form sacrificial buried oxide region 26", as shown in FIG. 4B, by photolithography and etch steps. An amorphous or polycrystalline silicon layer 27 is then deposited, as shown in FIG. 4C. The polycrystalline layer 27 is then etched, and removed, except for the portion over sacrificial buried oxide region 26", to form region 27', representing a germ for epitaxial growth, as shown in FIG. 4D. An epitaxial layer 28 is then grown to obtain the structure shown in FIG. 4E, which corresponds to FIG. 2E, showing polysilicon region 29 and epitaxial region 30.

Figure 5:
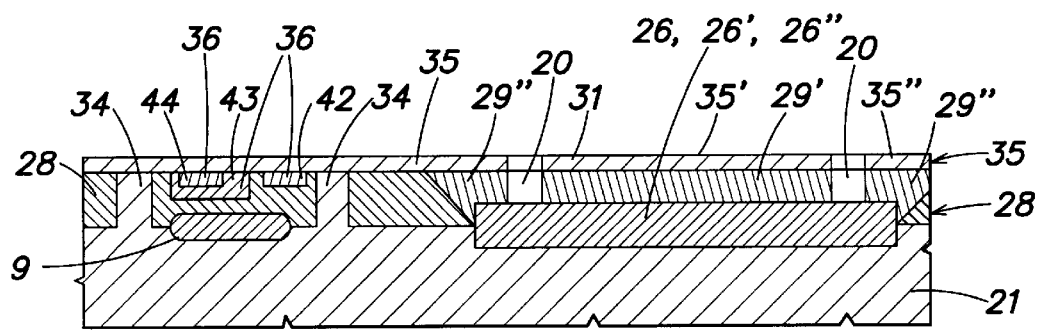
FIG. 5 is a cross-sectional illustration of the semiconductor wafer of FIGS. 2E, 3, or 4E, after the formation of integrated structures on and openings in the front surface.

Formation of the sacrificial buried oxide region, by any of the described methods, is typically followed by standard integrated circuit fabrication steps. For example, as shown in FIG. 5, P-type junction isolation regions 34, extending from surface 31 of epitaxial layer 28 to substrate 21, and an NPN transistor, presenting an N+ type collector contact region 42, a P-type base region 43, and an N-type emitter region 44, are formed in N-type epitaxial layer 28. If necessary, diffused regions for implementing the microsensors, microactuators or micromechanisms provided for in the process may be formed simultaneously with the integrated circuit. For example, when implanting the base region 43 of the NPN transistor, a heating element (not shown) may be formed in the case of a chemoresistive gas sensor, or piezoresistive elements (not shown) may be formed in the case of a pressure sensor. A dielectric layer 35 is then deposited and metal contacts 36 are formed, thereby obtaining the structure shown in FIG. 5 (which also shows an N+type buried layer 9).

Figure 7:
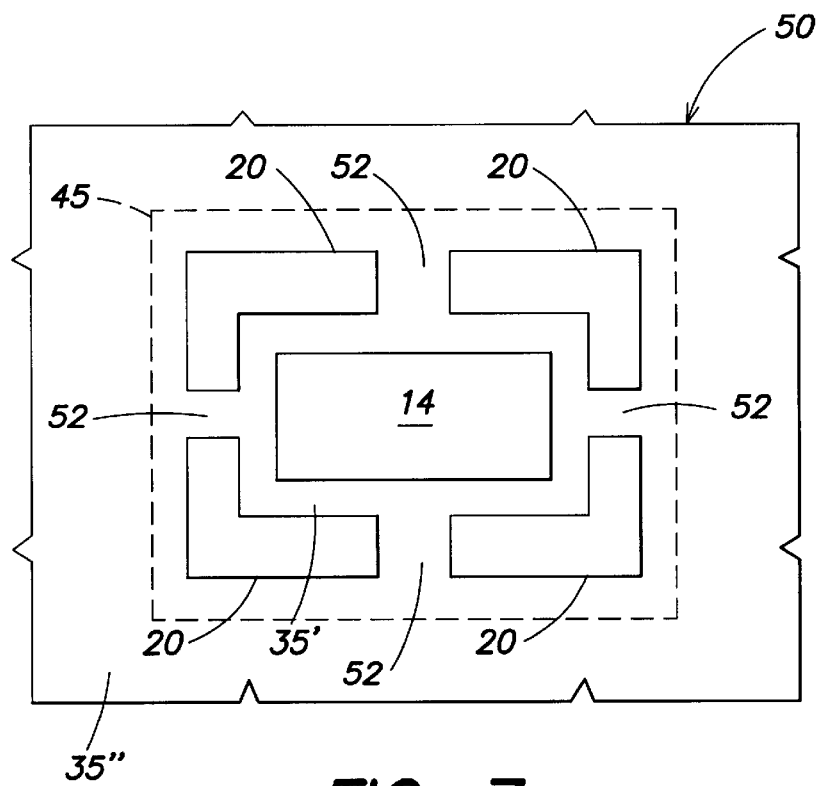
FIG. 7 shows a top plan view of a portion of the FIG. 8 wafer.

At this point, the suspended structures are formed by isotropically etching through the top surface of the wafer. According to the present embodiment, a trench 20, extending from and including dielectric layer 35 to sacrificial buried oxide region 26, 26', 26" is formed. As shown in FIG. 5, photolithographic masking and chemical etching are used to remove portions of dielectric layer 35 and polysilicon region 29 over sacrificial buried oxide region 26 to form trench 20. In the present embodiment, trench 20 preferably extends in a closed line, e.g. along the sides of a rectangle (FIG. 7) or along the circumference of a circle, so as to laterally define inner portions 29', 35' of polysilicon region 29' and dielectric layer 35, and to separate them from respective outer portions 29", 35", with the exception of connecting and supporting arms 52 extending between inner portions 29', 35' and respective outer portions 29", 35". Trench 20 advantageously extends close to the periphery of sacrificial buried oxide region 26, 26', 26".

Figure 6:
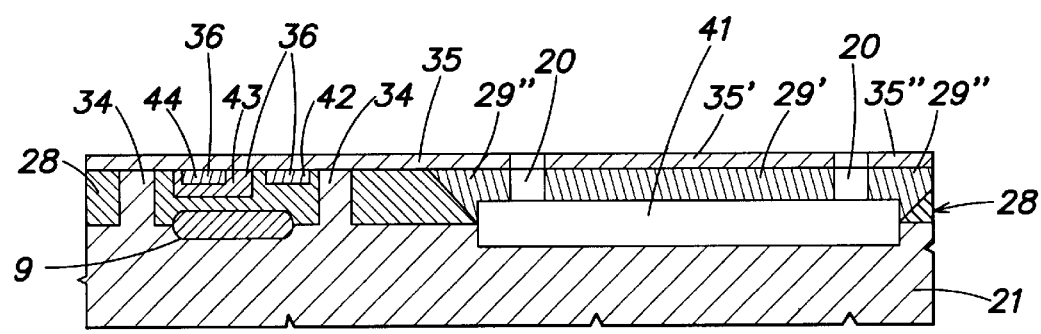
FIG. 6 is a cross-sectional illustration of the semiconductor wafer of FIG. 5 after the sacrificial buried region has been etched isotropically via openings in the front surface.

At this point, sacrificial buried oxide region 26, 26', 26" is removed using hydrofluoric acid to form an opening or air gap 41 beneath inner polysilicon portion 29', as shown in FIG. 6. Removal of sacrificial buried oxide region 26, 26', 26" creates a suspended region, wherein structures isolated thermally or mechanically from the substrate (static structures such as chemoresistive gas or piezoresistive pressure sensors), movable structures for detecting external signals (kinematic structures such as flow or motion sensors), or mechanical structures (dynamic structures such as micromotors or microactuators) may be formed.

Before or after the sacrificial buried oxide region 26, 26', 26" is removed, regions or layers may be formed according to the type of structure to be fabricated. For example, before forming trench 20, a tin oxide film 14 may be deposited and defined over inner polysilicon portion 29' and respective inner dielectric portion 35' to form a chemoresistive gas sensor shown schematically by 50 in the FIG. 7 plan view, in which the dotted line 45 indicates the edge of air gap 41, and which shows trench 20 separating inner and outer dielectric portions 35' and 35".

Preferred Devices: Piezoresistor Formed Near Edges of Poly

Figure 9:
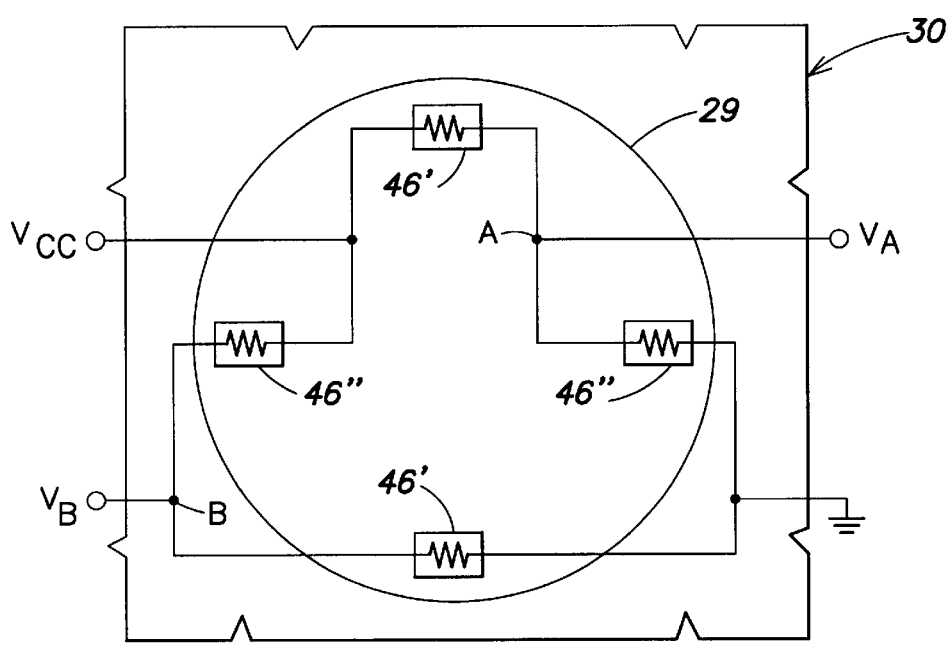
FIG. 9 is a top-view illustration of a detail of the embodiment illustrated in FIGS. 8A and 8B.
Figure 8A:
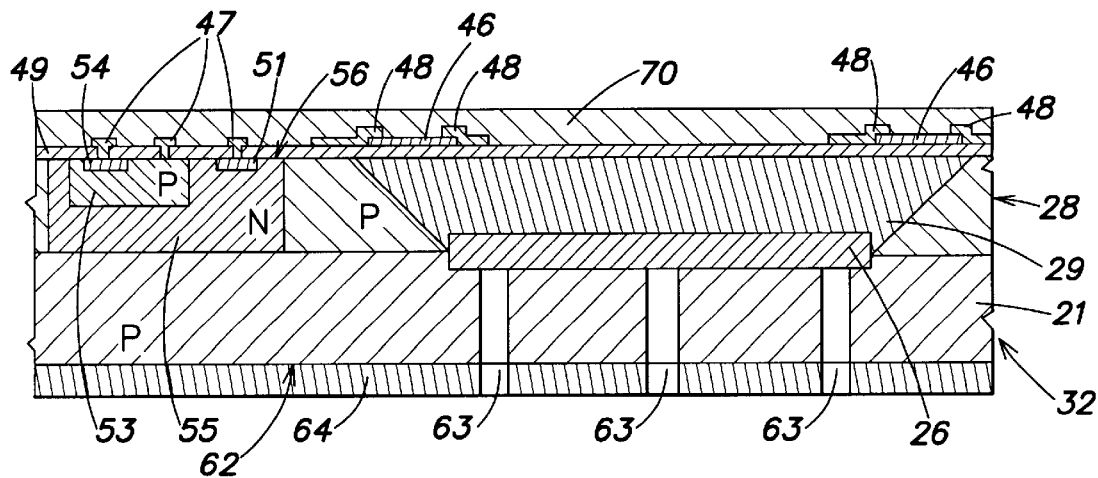
FIG. 8A is a cross-sectional illustration of FIGS. 2E, 3, or 4E after the formation of piezoresistive sensors on the front surface of the semiconductor wafer, followed by anisotropic etching of the rear surface to form opening therein.
Figure 8B:
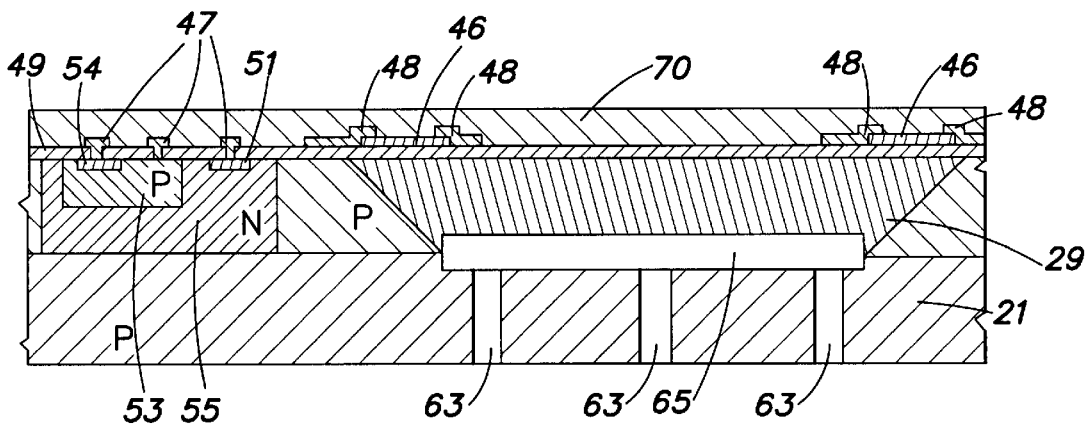
FIG. 8B is a cross-sectional illustration of the wafer of FIG. 8A after isotropically etching the sacrificial buried oxide region to form the final piezoresistive sensor, including an air gap formed in the wafer.

In a preferred embodiment, shown in FIGS. 8A and 8B, N-type well regions 55, extending from surface 56 of epitaxial layer 28 to substrate 21, and an NPN transistor having an N+-type collector contact region 51, a P-type base region 53, and an N+-type emitter region 54, are formed in P-type epitaxial layer 28. Thereafter, a dielectric layer 49 is deposited and a P-type polycrystalline silicon layer (doped with boron) having a thickness of 0.2–0.4 μm is deposited; the polysilicon layer is then shaped to form piezoresistive resistors 46. In the present embodiment, which is intended to increase sensor sensitivity, piezoresistors 46 are formed near the edges of the polycrystalline region 29 intended to form the diaphragm, i.e. in the maximum sensitivity region, as shown in FIG. 9. In particular, the resistors are oriented such that when the diaphragm is pressure stressed, the resistance of resistors 46' increases, while the resistance of resistors 46" decreases. Metal contacts 47 and 48 and interconnection lines are then formed to connect the piezoresistors to define a Wheatstone bridge, as shown in FIG. 9. As a consequence, when a pressure is exerted, voltage $V_A$ at node A decreases, while voltage $V_B$ at node B increases. Thus, bridge unbalancing allows the exerted pressure to be measured.

In another embodiment of the invention, the suspended structures may be formed by anisotropically etching, preferably by Reactive Ion Etching (RIE), through the rear surface of the wafer. According to this embodiment, one or more dielectric and passivation layers are deposited (illustrated as a single layer 70 in FIG. 8A). The rear surface 62 of the wafer is completely covered by mask 64 with the exception of windows corresponding to the sacrificial buried oxide region 26, 26', 26", and substrate 21 is then anisotropically RIE etched to form openings 63 having substantially vertical sidewalls, as shown in FIG. 8A. Alternatively, instead of a RIE etching step, an etch with a TMAH (TetraMethylAmmoniumHydroxide) solution may be carried out, which gives rise to openings with inclined sidewalls having an angle of about 54°, and thus a substantially frusto-conical shape, by which it is possible to precisely control the diaphragm thickness by virtue of the high etching selectivity with respect to oxide.

Thereafter, sacrificial buried oxide region 26, 26', 26" is etched and completely removed through openings 63 using hydrofluoric acid, thus forming an air gap 65 extending beneath inner polycrystalline region 29, as shown in FIG. 8B. Polycrystalline region 29 thus forms the diaphragm of the pressure sensor. After removing mask 64, the final structure shown in FIG. 8b forms a sensor for detecting the absolute and/or differential pressure.

Figure 10:
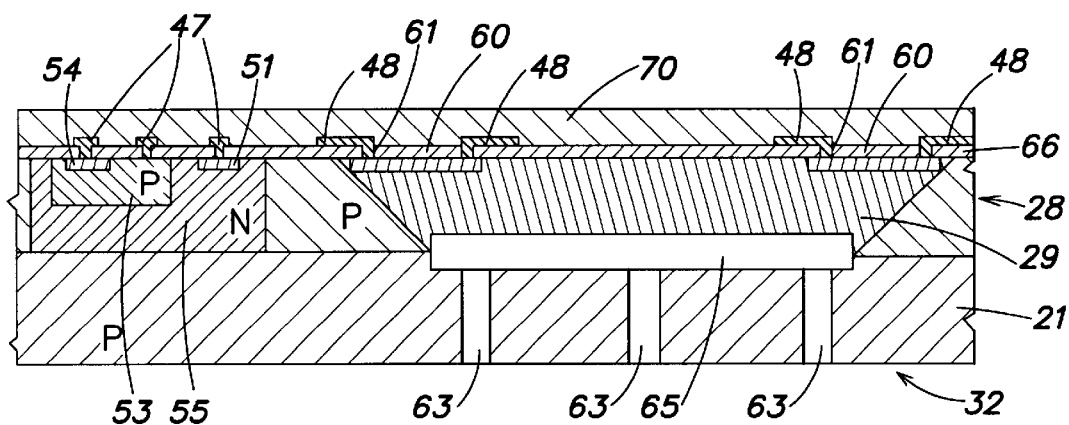
FIG. 10 is an illustration of another embodiment of the present invention, in which the piezoresistive sensors are integrated into the diaphragm.

According to a different embodiment of the just described process, instead of being formed by a polysilicon layer deposited above surface 56 of wafer 32, the piezoresistors are integrated in the diaphragm 29, as shown in FIG. 10, wherein piezoresistors 60 are formed using the usual steps of masking and implanting a suitable doping agent of N-type, in this case simultaneously with other components of the signal processing circuit. Electrical contacts 48 having portions extending through openings 61 of the dielectric layer 66 allow the piezoresistors 60 to be connected according to the diagram of FIG. 10, as above described.

ADVANTAGES

The advantages of the fabrication methods described are as follows. In particular, the suspended region is thicker, therefore providing better mechanical characteristics and fewer signal processing problems as compared with deposited films. In addition, if the suspended structure is used to form a pressure sensor, it is more sensitive compared to similar types formed using deposited films.

Because the suspended structure is formed from an epitaxial layer, it has a high degree of flexural rigidity, and is therefore highly unlikely to collapse and adhere to the substrate. Thus, the suspended structures of the present invention possess better mechanical characteristics compared to surface micromachined structures.

The suspended structure may be integrated with electronic control components on one chip, and may be formed using only three additional masks as compared with standard analog/digital fabrication processes, i.e. for defining sacrificial buried oxide region 26, 26', 26", defining the germ for epitaxial growth 27', and etching trench 20 or 63.

The method described is extremely low-cost as compared with those involving the use of SOI or silicon-fusion-bonded substrates.

Finally, the buried oxide region may be formed with a desired degree of flatness. That is, the embodiment in FIGS. 2A–2E may be used in cases requiring a highly flat chip, and the FIG. 3 and FIGS. 4A–4C embodiments when flatness is not particularly essential.

The described process allows considerable simplification of the working process with respect to known solutions and avoids many problems during packaging, by eliminating the anodic bonding step. The sensor may be integrated together with the relative circuitry, since the fabrication does not require the use of alkaline ion-based pollutant chemical agents. A spatial integration may be obtained which is comparable with that of surface micromachined structures and which is one to two order of magnitude greater than bulk-micromachined sensors. The polycrystalline structure of region 29 is not problematic to the finished sensor, since this region does not accommodate signal processing components—only, in the onstances shown, piezoresistors. On the other hand, polycrystalline region 29 as grown at high temperatures, has very good mechanical features, and in particular a very low internal mechanical stress and a Young's modulus which is comparable with that of monocrystalline silicon. Therefore, a diaphragm formed from polycrystalline region 29 has mechanical characteristics which are much better that surface micromachined structures. Finally, with the described techniques, precise control of the diaphragm 29 thickness is obtained, and thus, very good reproducibility.

Clearly, changes may be made to the method as described and illustrated herein without, however, departing from the scope of the present invention. In particular, isolation regions 34 in epitaxial layer 28 may be of a type other than that shown, e.g. dielectric as opposed to junction; the electronic components integrated in the same chip may be both bipolar and MOS types; the conductivity of the various regions may be other than as shown; and the structure may be used for any sensor or mechanism employing suspended regions of the type described.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method of fabricating integrated microstructures of semiconductor material, the method including steps of:
    forming a sacrificial buried region of insulating material on a substrate of monocrystalline semiconductor material;
    epitaxially growing a first semiconductor material layer on an upper surface of said substrate;
    said first semiconductor material layer comprising a polycrystalline region over said sacrificial buried region, and a monocrystalline region elsewhere, said substrate and said semiconductor material layer surrounding said sacrificial buried region on all sides; and
    anisotropically etching openings, substantially narrow with respect to a horizontal width of the sacrificial buried region, having lateral walls that are substantially vertical, the openings etched from a lower surface of the substrate to the sacrificial buried region; and
    removing said sacrificial buried region via the openings to form an air gap between the lower surface of the substrate and the polycrystalline region.

2. A method as claimed in claim 1, wherein the step of forming a sacrificial buried region comprises the steps of:
   masking said substrate with a mask of nonoxidizable material presenting a window; and
   thermally growing said sacrificial buried region at said window.

3. A method as claimed in claim 2, wherein the step of masking said substrate comprises the steps of:
   forming an oxide layer over said substrate;
   depositing a nitride layer over said oxide layer; and
   defining said nitride layer to form said mask.

4. A method as claimed in claim 3, comprising the steps of:
   removing a portion of said oxide layer at said window following said step of masking said substrate; and
   removing a portion of said substrate at said window to form a recess in the substrate; and
   wherein said thermally growing step comprises the step of growing said sacrificial buried region to substantially fill said recess.

5. A method as claimed in claim 4, wherein said thermally growing step comprises the step of locally oxidizing said substrate at said window.

6. A method as claimed in claim 2, wherein the step of forming a sacrificial buried region comprises the steps of:
   growing an oxide layer over said substrate; and
   lithographically defining said oxide layer.

7. A method as claimed in claim 4, wherein the step of growing a first semiconductor material layer is preceded by the steps of:
   depositing, on said substrate, a second semiconductor material layer covering said sacrificial buried region; and
   selectively removing said second semiconductor material layer to form a germ region over said sacrificial buried region.

8. A method as claimed in claim 5, wherein the step of growing a first semiconductor material layer is preceded by the steps of:
   depositing, on said substrate, a second semiconductor material layer covering said sacrificial buried region; and
   selectively removing said second semiconductor material layer to form a germ region over said sacrificial buried region.

9. A method as claimed in claim 6, wherein the step of growing a first semiconductor material layer is preceded by the steps of:
   depositing, on said substrate, a second semiconductor material layer covering said sacrificial buried region; and
   selectively removing said second semiconductor material layer to form a germ region over said sacrificial buried region.

10. A method as in claim 1, further comprising:
    selectively removing portions of said polycrystalline region and said substrate to form a trench extending from a surface of said polycrystalline region to said sacrificial buried region.

11. A method as in claim 10, further comprising:
    removing said sacrificial buried region via said trench, such that an air gap is formed between between said substrate and said semiconductor material layer, said polycrystalline region forming a suspended structure.

12. A method as claimed in claim 7, wherein the step of selectively removing portions of said polycrystalline region is preceded by the steps of:
    forming, in said first semiconductor material layer, regions of opposite conductivity forming integrated electronic components;
    forming a dielectric layer over said first semiconductor material layer; and
    forming electric contact regions of electrically conductive material.

13. A method as claimed in claim 8, wherein the step of selectively removing portions of said polycrystalline region is preceded by the steps of:
    forming, in said first semiconductor material layer, regions of opposite conductivity forming integrated electronic components;
    forming a dielectric layer over said first semiconductor material layer; and
    forming electric contact regions of electrically conductive material.

14. A method as claimed in claim 9, wherein the step of selectively removing portions of said polycrystalline region is preceded by the steps of:
    forming, in said first semiconductor material layer, regions of opposite conductivity forming integrated electronic components;
    forming a dielectric layer over said first semiconductor material layer; and
    forming electric contact regions of electrically conductive material.

15. The method of claim 10, comprising:
    forming piezoresistive elements before selectively removing portions of said substrate.

16. The method of claim 15, wherein said piezoresistive elements are formed by:
    forming a dielectric layer on said semiconductor material layer;
    forming piezoresistive regions on said dielectric layer and at a lateral delimitation edge of said polycrystalline region; and
    forming interconnection and electrical contact regions of electrically conductive material connecting said piezoresistive regions to form a measure bridge structure.

17. The method of claim 15, wherein said piezoresistive regions are formed by deposited doped polycrystalline silicon.

18. The method of claim 15, wherein said step of forming piezoresistive elements comprises the steps of:
    forming piezoresistive regions in said polycrystalline region at a lateral delimitation edge thereof;
    forming a dielectric layer on said semiconductor material layer, said dielectric layer having openings at said piezoresistive regions; and
    forming interconnection and electrical contact regions of electrically conductive material having portions extending through said openings, said piezoresistive regions and said interconnection regions forming a measure bridge structure.

19. The method of claim 15, wherein said semiconductor material layer includes a first conductivity type and said step of forming piezoresistive regions comprises the step of implanting doping ions having a second conductivity type.

20. The method of claim 15, wherein the piezoresistive elements are formed by:

forming a dielectric layer on said semiconductor material layer;

forming piezoresistive regions on said dielectric layer and at a lateral delimitation edge of said polycrystalline region; and forming interconnection and electrical contact regions of electrically conductive material connecting said piezoresistive regions to form a measure bridge structure.

21. The method of claim 1, comprising:

forming piezoresistive elements before etching the openings.

22. The method of claim 21, wherein said piezoresistive elements are formed by:

forming a dielectric layer on said semiconductor material layer;

forming piezoresistive regions on said dielectric layer and at a lateral delimitation edge of said polycrystalline region; and forming interconnection and electrical contact regions of electrically conductive material connecting said piezoresistive regions to form a measure bridge structure.

23. The method of claim 21, wherein said piezoresistive regions are formed by deposited doped polycrystalline silicon.

24. The method of claim 21, wherein said step of forming piezoresistive elements comprises the steps of:

forming piezoresistive regions in said polycrystalline region at a lateral delimitation edge thereof;

forming a dielectric layer on said semiconductor material layer, said dielectric layer having openings at said piezoresistive regions; and forming interconnection and electrical contact regions of electrically conductive material having portions extending through said openings, said piezoresistive regions and said interconnection regions forming a measure bridge structure.

25. The method of claim 21, wherein said semiconductor material layer includes a first conductivity type and said step of forming piezoresistive regions comprises the step of implanting doping ions having a second conductivity type.

26. The method of claim 21, wherein the piezoresistive elements are formed by:

forming a dielectric layer on said semiconductor material layer;

forming piezoresistive regions on said dielectric layer and at a lateral delimitation edge of said polycrystalline region; and forming interconnection and electrical contact regions of electrically conductive material connecting said piezoresistive regions to form a measure bridge structure.

27. A method of fabricating integrated microstructures, the method comprising acts of:

forming a sacrificial region of insulating material on an upper surface of a semiconductor substrate;

providing a first semiconductor layer of a first conductivity type on the substrate comprising a polycrystalline region over the sacrificial region and a monocrystalline region elsewhere;

disposing at least one doped region of a second conductivity type within the polycrystalline region of the first semiconductor layer to provide at least one piezoresistive element;

removing said sacrificial buried region.

28. The method of claim 27 wherein the at least one doped region is formed at the periphery of the polycrystalline region.

29. The method of claim 27, further comprising the act of providing openings to the sacrificial region by which the sacrificial layer is removed.

30. The method of claim 29, wherein the openings are anisotropically etched through the first semiconductor layer to the sacrificial layer to form an air gap between the polycrystalline region and the substrate.

31. The method of claim 29, wherein the openings are anisotropically etched from a lower surface of the substrate to the sacrificial layer to form an air gap between the polycrystalline region and the substrate.

32. The method of claim 27, wherein the act of disposing the at least one doped region includes implanting the at least one doped region within the polycrystalline region.

* * * * *